United States Patent
Trinh et al.

(10) Patent No.: US 10,176,866 B1
(45) Date of Patent: Jan. 8, 2019

(54) RECAP LAYER SCHEME TO ENHANCE RRAM PERFORMANCE

(71) Applicant: Taiwan Semiconductor Manufacturing Co., Ltd., Hsin-Chu (TW)

(72) Inventors: Hai-Dang Trinh, Hsinchu (TW); Hsing-Lien Lin, Hsin-Chu (TW); Hsia-Wei Chen, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/793,095

(22) Filed: Oct. 25, 2017

Related U.S. Application Data

(60) Provisional application No. 62/562,556, filed on Sep. 25, 2017.

(51) Int. Cl.
  *G11C 11/00* (2006.01)
  *G11C 13/00* (2006.01)

(52) U.S. Cl.
  CPC ...... *G11C 13/0007* (2013.01); *G11C 2213/53* (2013.01); *G11C 2213/79* (2013.01); *G11C 2213/82* (2013.01)

(58) Field of Classification Search
  CPC ............ G11C 13/0007; G11C 2213/53; G11C 2213/79; G11C 2213/82
  See application file for complete search history.

(56) References Cited

U.S. PATENT DOCUMENTS

| | | | | |
|---|---|---|---|---|
| 9,385,316 | B2 * | 7/2016 | Liao | H01L 45/146 |
| 9,431,603 | B1 * | 8/2016 | Hsieh | H01L 45/085 |
| 9,431,609 | B2 * | 8/2016 | Dang | H01L 45/08 |
| 9,966,139 | B2 * | 5/2018 | Chou | G11C 13/0069 |

\* cited by examiner

*Primary Examiner* — Pho M Luu
(74) *Attorney, Agent, or Firm* — Eschweiler & Potashnik, LLC

(57) ABSTRACT

An RRAM device is disclosed. The RRAM device includes a lower electrode structure over a conductive lower interconnect layer, an upper electrode structure over the lower electrode structure, and a switching layer between the lower electrode and the upper electrode structure. The switching layer has switching layer outer sidewalls. The RRAM device also includes a recap layer having a vertical portion that extends vertically from corners of the switching layer along the upper electrode sidewalls. The recap layer has a horizontal portion that extends horizontally from the corners to the switching layer outer sidewalls.

20 Claims, 10 Drawing Sheets

… … …

RECAP LAYER SCHEME TO ENHANCE RRAM PERFORMANCE

REFERENCE TO RELATED APPLICATION

This Application claims priority to U.S. Provisional Application No. 62/562,556 filed on Sep. 25, 2017, the contents of which are hereby incorporated by reference in their entirety.

BACKGROUND

Many modern day electronic devices contain electronic memory configured to store data. Electronic memory may be volatile memory or non-volatile memory. Volatile memory stores data when it is powered, while non-volatile memory is able to store data when power is removed. Resistive random access memory (RRAM) is one promising candidate for next generation non-volatile memory technology due to its simple structure and its compatibility with CMOS logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
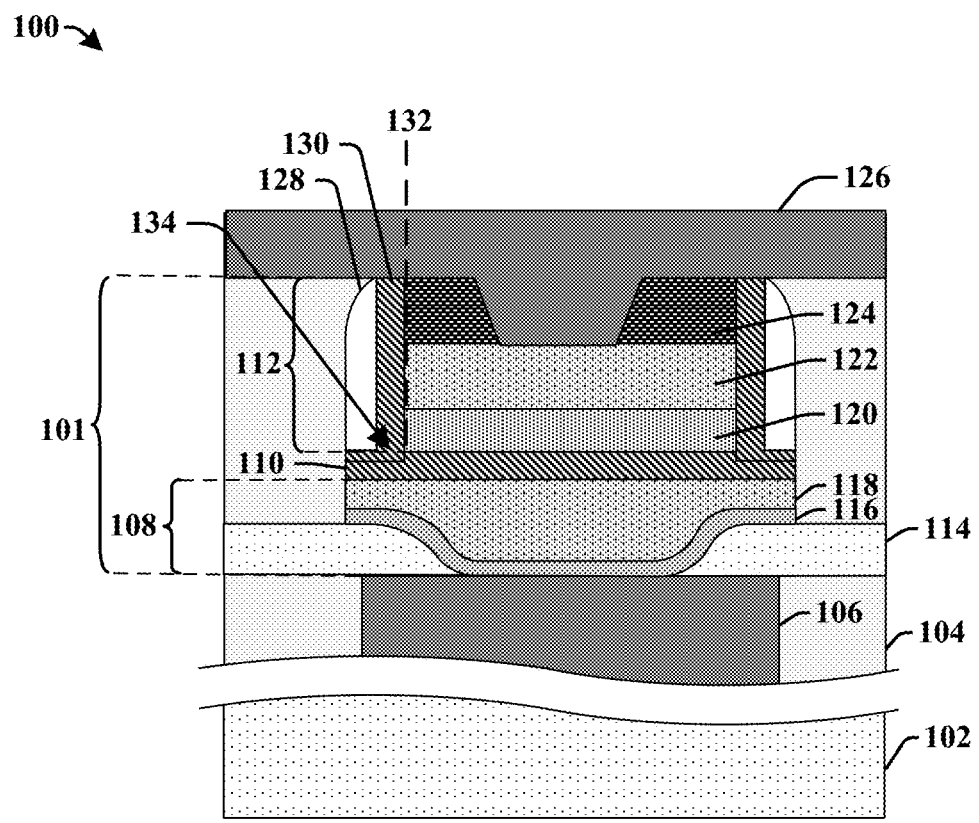
FIG. 1 illustrates a cross-sectional view of some embodiments of a resistive random access memory (RRAM) device having a recap layer configured to provide a good balance of endurance and data retention.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random access memory (RRAM) devices are configured to store data by switching between different resistive values corresponding to different data states. To enable such 'resistive switching,' RRAM devices have a lower electrode that is separated from an upper electrode by a switching layer having a variable resistance. The switching layer typically comprises a high-k dielectric material that is able to alter its internal resistance in response to an applied bias. Resistive switching allows for an RRAM device to change an electrical resistance of the data storage layer between a high resistive state corresponding to a first data state (e.g., a "0") and a low resistive state corresponding to a second data state (e.g., a "1").

During fabrication of an RRAM device, the upper electrode is typically patterned by a first etching process while the switching layer and lower electrode are patterned by a second etching process that uses the upper electrode and sidewall spacers as a mask. The separate etching processes cause the lower electrode and switching layer to be wider than the upper electrode. However, because the lower electrode and switching layer to be wider than the upper electrode, the switching layer may be over-etched, resulting in a thinned switching layer around sidewalls of the upper electrode. During operation, sharp edges of the upper electrode cause a peak in the electric field, which combined with dangling bonds or defects in the thinned sections of the switching layer may result in leakage paths between the upper and lower electrodes. These leakage paths negatively affect data retention and endurance of the RRAM device.

The present disclosure relates to an RRAM device having a recap layer configured to provide for good endurance and data retention, and an associated method of formation. In some embodiments, the RRAM device comprises a lower electrode structure disposed over a lower interconnect layer surrounded by a lower inter-level dielectric layer. An upper electrode structure is disposed over the lower electrode structure and a switching layer is arranged between them. The lower electrode structure, switching layer, and upper electrode structure form the memory cell of the RRAM.

A recap layer is formed over the top of the upper electrode structure and extends down the sidewalls of the upper electrode structure to the switching layer. Accordingly, the recap layer compensates the switching layer thickness loss at the corners where the switching layer meets the upper electrode structure. Furthermore, the recap layer may be comprised of a material similar to switching layer to improve bonding between the recap layer and the switching layer. For example, the switching layer and the recap layer may be a high-k material. The recap layer also acts as a barrier to prevent re-sputtered conductive material (e.g., from patterning of the lower electrode structure) from forming conductive paths along sidewalls of the memory cell.

Accordingly, increasing the thickness of the switching layer at the corner with the recap layer reduces leakage and provides the RRAM device with a good balance of endurance and data retention.

FIG. 1 illustrates a cross-sectional view of some embodiments of a resistive random access memory (RRAM) device having a recap layer configured to provide a good balance of endurance and data retention. The integrated chip 100 comprises an RRAM device surrounded by an inter-level dielectric (ILD) structure 104 arranged over a substrate 102. One or more lower interconnect layers 106 (e.g., a metal via and/or a metal wire) are embedded in the ILD structure 104.

The RRAM device 101 comprises a lower electrode structure 108, a switching layer 110, and an upper electrode structure 112.

The lower electrode structure 108 is separated from the substrate 102 by the one or more lower interconnect layers 106. In some embodiments, the lower electrode structure 108 includes a barrier layer 116 seated in a lower dielectric layer 114. In some embodiments, the barrier layer 116 is a diffusion barrier layer comprising a refractor metal nitride, such as tantalum nitride, titanium nitride, or the like. A bottom electrode 118 overlies the barrier layer 116. In some embodiments, the bottom electrode 118 may comprise a conductive material, such as tantalum (Ta) and/or titanium (Ti) and/or TiN and/or TaN.

The switching layer 110 separates the lower electrode structure 108 from the upper electrode structure 112. The switching layer 110 is configured to store data states by undergoing reversible changes between a high resistance state associated with a first data state (e.g., a '0') and a low resistance state associated with a second data state (e.g., a '1'). For example, to achieve a low resistance state within the switching layer 110, a first set of bias conditions may be applied to the lower electrode structure 108 and the upper electrode structure 112. Alternatively, to achieve a high resistance state within the switching layer 110, a second set of bias conditions may be applied to the lower electrode structure 108 and the upper electrode structure 112.

The switching layer 110 is comprised of a switching material. In some embodiments, the switching material is a high-k dielectric material such as an oxide of one or more metals (e.g., hafnium (Hf), aluminum (Al), zirconium (Zr), tantalum (Ta), lanthanum (La), titanium (Ti), vanadium (V), niobium (Nb), etc.). The switching layer may be approximately 10-100 angstroms thick.

The upper electrode structure 112 includes a capping layer 120, a top electrode 122, and a hard mask layer 124. The capping layer 120 is arranged between the switching layer 110 and the top electrode 122. In some embodiments, the capping layer 120 may comprise a metal (e.g., such as titanium (Ti), hafnium (Hf), platinum (Pt), aluminum (Al), or the like) or a metal oxide (e.g., such as titanium oxide ($TiO_x$), hafnium oxide ($HfO_x$), zirconium oxide ($ZrO_x$), germanium oxide ($GeO_x$), cesium oxide ($CeO_x$), or the like). The top electrode 122 may comprise a metal, like the bottom electrode 118, and be for example, Ta, Ti, TiN, TaN, etc. The hard mask layer 124 is arranged over the top electrode 122 and may be comprised of silicon nitride (SiN). An upper metal via 126 extends through the hard mask layer 124 to contact the top electrode 122. Although a single upper metal via 126 is shown, the upper metal via 126 may be one of a plurality of metal layers that function to electrically connect the RRAM device 101 with other devices on the IC 100. Accordingly, the upper metal via 126 is comprised of a conductive material.

In some embodiments, sidewall spacers 128 are positioned on opposite sides of the capping layer 120, the top electrode 122, and the hard mask layer 124. The outer sidewall of the sidewall spacers 128 is collinear with the outer sidewalls of the switching layer 110. The sidewall spacers 128 may, for example, be oxide, nitride, or some other dielectric. Further, for ease of illustration, only one of the sidewall spacers 128 is labeled.

One or more recap layers 130 are arranged between the sidewall spacers 128 and the inner sidewalls of the capping layer 120. The sidewalls of the capping layer 120, the top electrode 122, and the hard mask layer 124 are collinear and form what will be referred to as the upper electrode sidewalls 132. The one or more recap layers 130 extend vertically along the upper electrode sidewalls 132 from an upper surface of the switching layer 110, such that the lowermost surfaces of the one or more recap layers 130 contact the upper surface of the switching layer 110. The one or more recap layers 130 extend horizontally from the capping layer 120 to the outer sidewall of the switching layer 110. Here, a single recap layer is shown on either side of the upper electrode, but more or fewer recap layers may be used.

The one or more recap layers 130 are comprised of a material that is a similar material as the switching material of the switching layer 110. In some embodiments, the one of more recap layers 130 may comprise a high-k dielectric material. In some embodiments, the one of more recap layers 130 may comprise an oxide of one or more metals such as hafnium, aluminum, zirconium, tantalum, lanthanum, titanium, vanadium, niobium, or the like. For example, the one of more recap layers 130 may comprise hafnium oxide, hafnium aluminum oxide, hafnium tantalum oxide, tantalum oxide, tantalum aluminum oxide, or the like. In some embodiments, the one or more one or more recap layers 130 are a same material as the switching layer 110. For example, if the switching layer 110 is hafnium oxide, the one or more recap layers 130 may also be hafnium oxide. Due to the similarity in material, the recap layers 130 may bond well with the switching layer 110.

The recap layers 130 provide additional thickness at corners 134. For ease of illustration, only one corner 134 is labeled 134. However, as shown a second corner is formed on the other side of capping layer 120. The corners 134 are formed during patterning of the upper electrode structure 112, for example, by over etching the switching layer 110. As a result of the over etching, a thickness of the switching layer 110 is thinner at the corners 134. The smaller thickness along edges of the switching layer 110, combined with higher electrical fields caused by the sharp edges of the upper electrode 122 can lead to leakage along an edge of the switching layer 110, and cause device failure. The recap layers 130 can reduce leakage through the switching layer 110 by increasing the thickness along the edges of the switching layer 122.

Furthermore, because the recap material is similar, if not the same, as the switching material, the recap layers 130 reduce defects and dangling bonds at the corners 134, further reducing current leakage. The recap layers 130 also help to prevent the formation of leakage paths due to metal re-sputter during patterning of the lower electrode structure 108. For example, during patterning of the lower electrode structure 108, metal particles may be thrown off and redeposited on the switching layer 110 and upper electrode sidewalls 132, which can cause current leakage. The recap layers 130 form an insulating barrier between the re-sputtered metal particles and the top electrode 122, thereby reducing leakage from metal re-sputtering. By reducing leakage, the recap layers 130 causes enlargement of the switching window by approximately 1.2-2 times. Thus, the recap layers 130 provide the RRAM device with a good balance of endurance and data retention.

Figure 2:
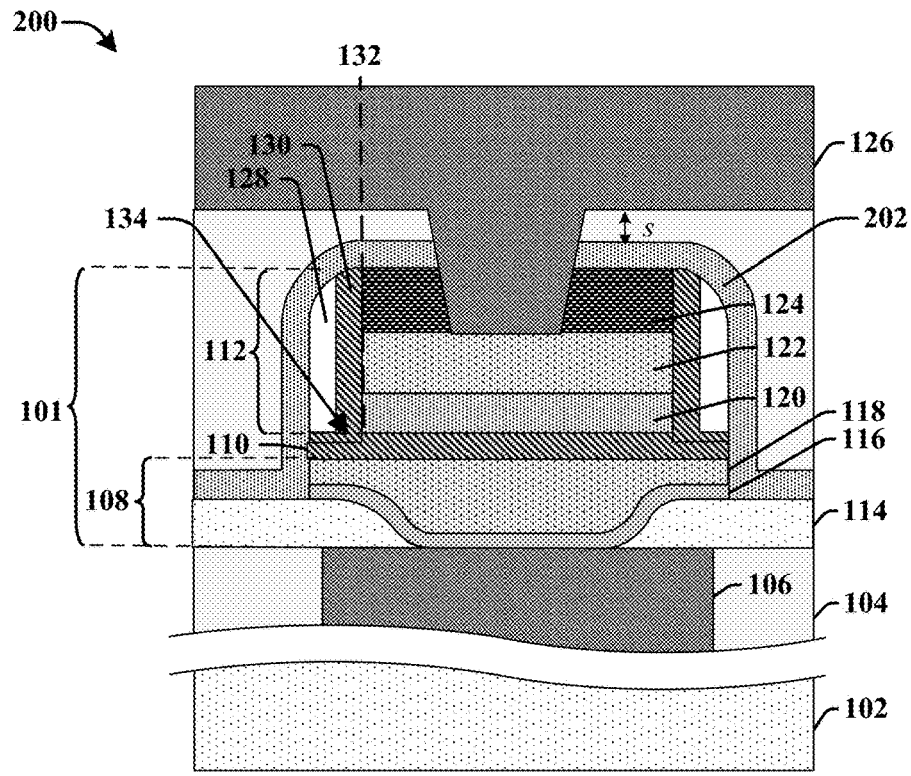
FIG. 2 illustrates a cross-sectional view of some additional embodiments of an integrated chip comprising an RRAM device having a recap layer arranged under an upper dielectric layer.

FIG. 2 illustrates a cross-sectional view 200 of some additional embodiments of an integrated chip comprising an RRAM device having a recap layer arranged under an upper dielectric layer 202. In some embodiments, the upper dielectric layer 202 has a first side that abuts the uppermost surface of the hard mask layer 124. A second side of the upper dielectric layer 202 is separated from the upper metal via 126 by a separation distance, s. The ILD structure 104 intervenes between the upper dielectric layer 202 and the upper metal via 126 in the separation distance, s. In various embodiments, the upper dielectric layer 202 may comprise a bi-layer structure (i.e., having two sub-layers) or a multi-layer structure (i.e., having three or more sub-layers).

Figure 3:
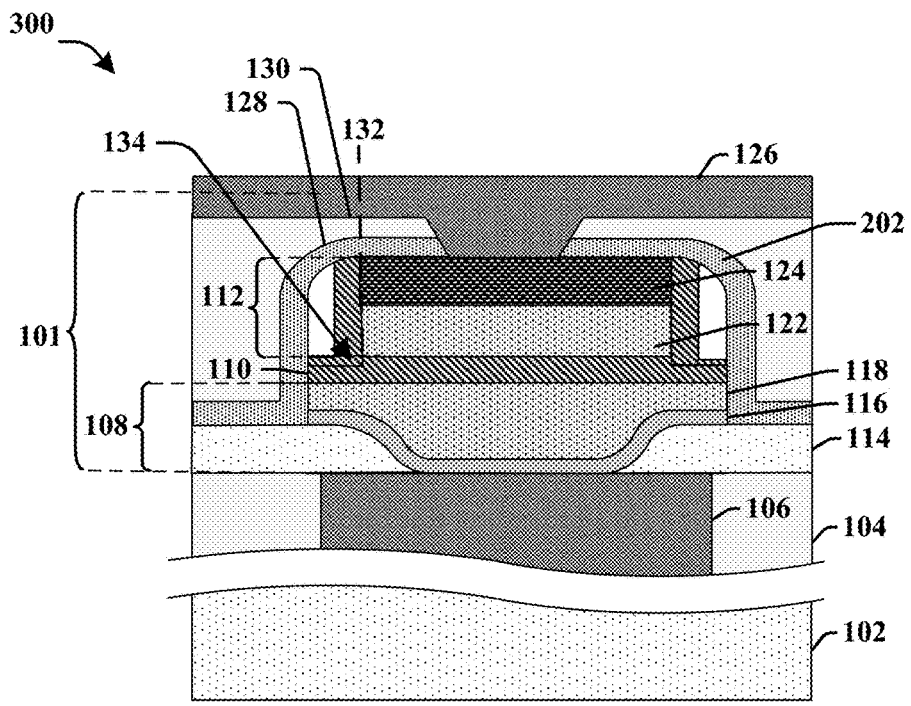
FIG. 3 illustrates a cross-sectional view of some additional embodiments of an integrated chip comprising an RRAM device having a recap layer.

FIG. 3 illustrates a cross-sectional view 300 of some additional embodiments of an integrated chip comprising an RRAM device having a recap layer.

As shown in cross-sectional view 300, the RRAM device comprises a switching layer 110 arranged between a bottom electrode 118 and a top electrode 122. The switching layer 110 has a bottom surface that directly contacts the bottom electrode 118. The switching layer 110 further has an upper surface that directly contacts the top electrode 122.

Figure 4:
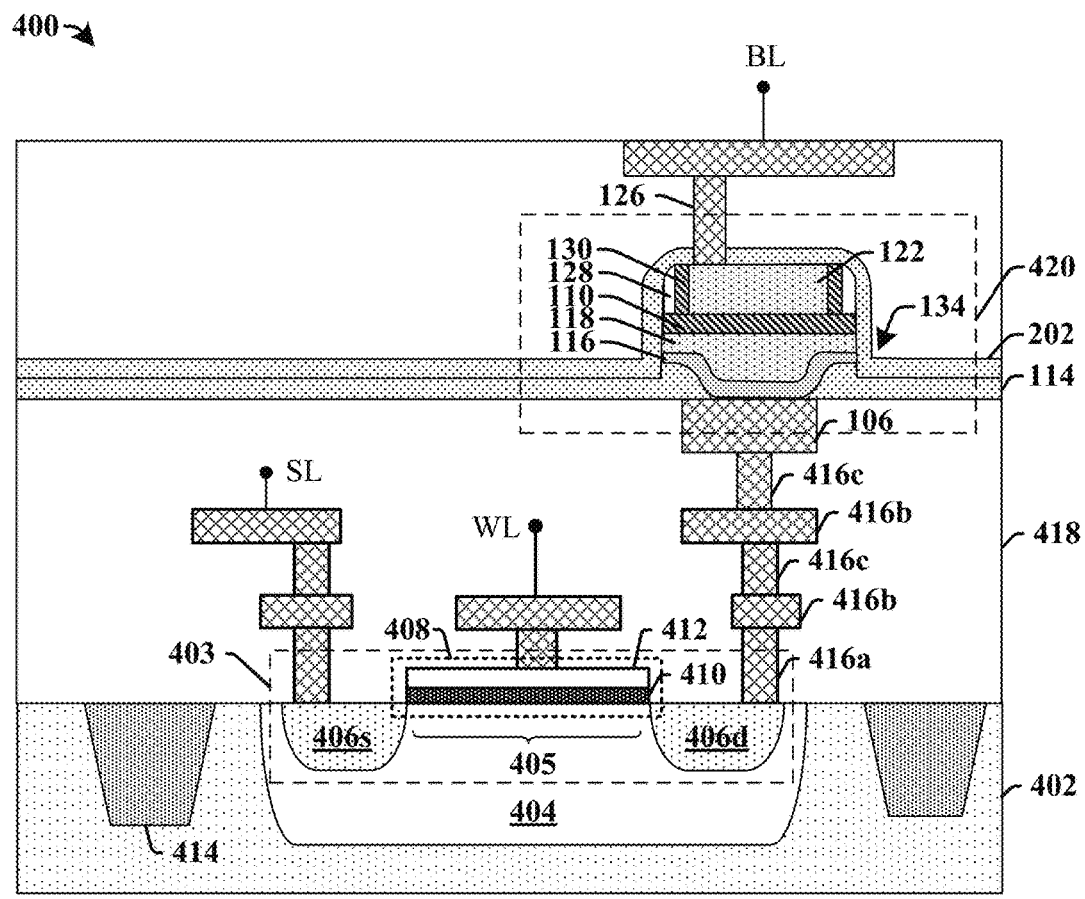
FIG. 4 illustrates a cross-sectional view of some embodiments of a detailed integrated chip structure having an RRAM device having a recap layer.

FIG. 4 illustrates a cross-sectional view of some embodiments of a detailed integrated chip structure having an RRAM device having a recap layer. The integrated chip 400 comprises a well region 404 disposed within a semiconductor substrate 402. A transistor 403 is arranged within the well region 404. The transistor 403 comprises a source region 406s that is separated from a drain region 406d by a channel region 405. A gate structure 408 is arranged over the channel region 405. The gate structure 408 comprises a gate electrode 412 separated from the channel region 405 by a gate dielectric layer 410. In some embodiments, the transistor 403 may be arranged between isolation regions 414 (e.g., shallow trench isolation regions) within the semiconductor substrate 402.

A first ILD structure 418 is arranged over the semiconductor substrate 402. In some embodiments, the first ILD structure 418 may comprise one or more layers of an oxide, a low-k dielectric, or an ultra-low-k dielectric. A plurality of interconnect layers including contacts 416a, metal wire layers 416b, and metal via layers 416c are surrounded by the first ILD structure 418. In some embodiments, the plurality of contacts 416a, metal wire layers 416b, and metal via layers 416c may comprise copper, tungsten, and/or aluminum. The metal wire layers 416b comprise a source-line SL comprising a first interconnect wire that is electrically coupled to the source region 406s. In some embodiments, the source-line SL may be arranged in a second metal wire layer that is connected to the source region 406s through a contact, a first metal wire layer, and a first metal via layer. The metal wire layers 416b further comprise a word-line WL comprising a second interconnect wire that is electrically coupled to the gate electrode 412. In some embodiments, the word-line WL may be arranged in the first metal wire layer that is connected to the gate electrode 412 by way of a contact.

An RRAM device 420 is arranged over the first ILD structure 418. The RRAM device 420 comprises a bottom electrode 118 that is vertically separated from the first ILD structure 418 by a barrier layer 116 embedded in a lower dielectric layer 114. The barrier layer 116 is electrically connected to the drain region 406d by the plurality of lower interconnect layers 106, which includes the plurality of contacts 416a, the metal wire layers 416b, and the metal via layers 416c. The RRAM device 420 further comprises a switching layer 110 located between the lower electrode structure 108 and an upper electrode structure 112. The upper electrode structure 112 includes the capping layer 120 and the top electrode 122. The recap layers 130 and the sidewall spacers 128 are arranged on either side of the upper electrode structure 112.

FIGS. 5-16 illustrate some embodiments of cross-sectional views 500-1600 showing a method of forming an integrated chip comprising an RRAM device having a recap layer configured to provide a good balance of endurance and data retention. Although FIGS. 5-16 are described in relation to a method, it will be appreciated that the structures disclosed in FIGS. 5-16 are not limited to such a method, but instead may stand alone as structures independent of the method.

Figure 5:
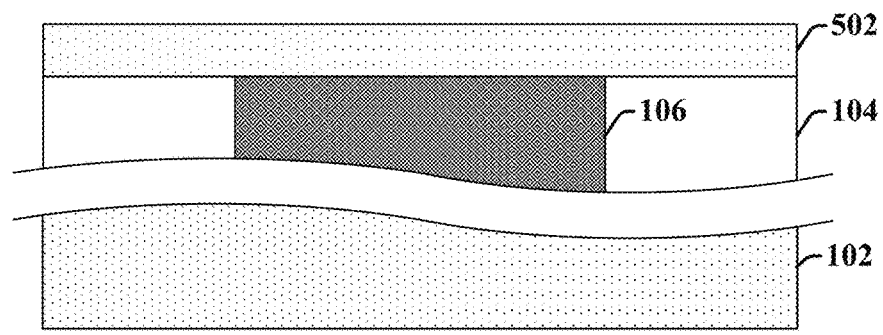
FIGS. 5-16 illustrate some embodiments of cross-sectional views showing a method of forming an integrated chip comprising an RRAM device having a recap layer.

As shown in cross-sectional view 500 of FIG. 5, a lower interconnect layer 106 is formed within a lower inter-level dielectric (ILD) layer 104 over a substrate 102. The substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, the lower interconnect layer 106 may be formed by selectively etching the lower ILD layer 104 (e.g., an oxide, a low-k dielectric, or an ultra-low-k dielectric) to define an opening within the lower ILD layer 104. A metal (e.g., copper, aluminum, etc.) is then deposited to fill the opening, and a planarization process (e.g., a chemical mechanical planarization process) is performed to remove excess metal.

A lower dielectric layer 502 is formed onto the lower interconnect layer 106 and the lower ILD layer 104. In some embodiments, the lower dielectric layer 502 may comprise silicon-nitride (SiN), silicon-carbide (SiC), or a similar composite dielectric film. In some embodiments, the lower dielectric layer 502 may be formed by a deposition technique (e.g., physical vapor deposition (PVD), chemical vapor deposition (CVD), PE-CVD, atomic layer deposition (ALD), sputtering, etc.) to a thickness in a range of between approximately 200 angstroms and approximately 300 angstroms.

Figure 6:
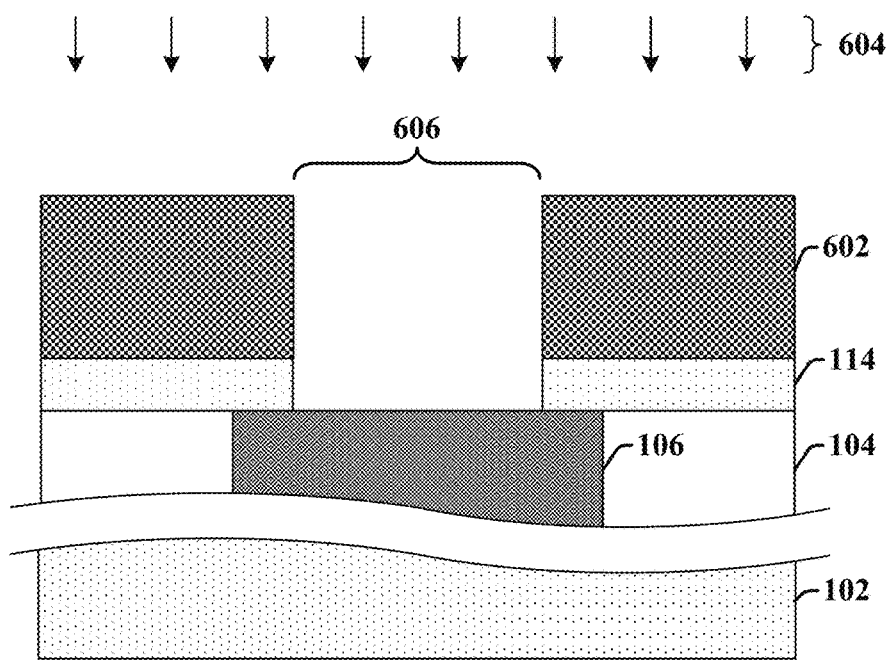

As shown in cross-sectional view 600 of FIG. 6, a first masking layer 602 is formed over the lower dielectric layer (502 of FIG. 5). The lower dielectric layer (502 of FIG. 5) is then selectively exposed to a first etching operation 604 (e.g., a dry etchant) in areas not covered by the first masking layer 602 to form the lower dielectric layer 114. The first etchant 604 defines the opening 606 in the lower dielectric layer 114, which extends through the lower dielectric layer 114 to a lower interconnect layer 106.

Figure 7:
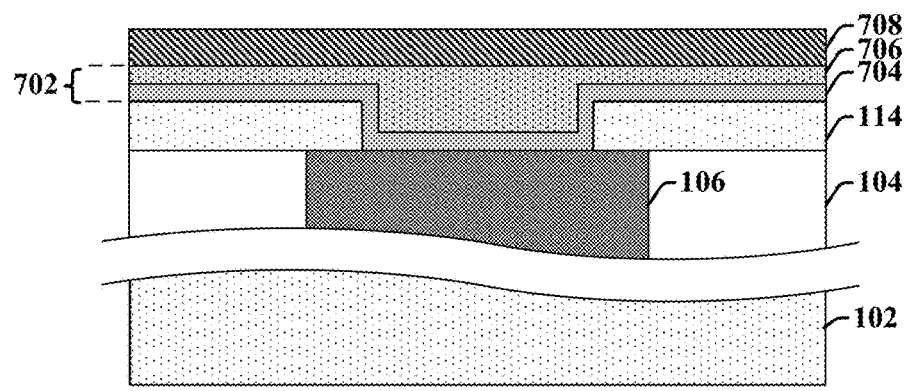

As shown in cross-sectional view 700 of FIG. 7, a layered lower electrode 702 is formed over the lower interconnect layer 106 and the lower dielectric layer 114. In some embodiments, the layered lower electrode 702 is formed by depositing one or more lower electrode films 704-706. For example, the layered lower electrode 702 may be formed by depositing a first lower electrode film 704 and subsequently forming a second lower electrode film 706 over the first lower electrode film 704.

The first lower electrode film 704 extends from within the opening 606 to a position overlying the lower dielectric layer 114. In some embodiments, the first lower electrode film 704 may comprise copper (Cu), tantalum nitride (TaN) or titanium nitride (TiN), for example. In some embodiments, the first lower electrode film 704 may be conformal with the lower dielectric layer 114 and contacts the lower interconnect layer 106. A planarization process (e.g., a chemical mechanical planarization process) may subsequently be performed. In some embodiments, the etching and planarization process results in the first lower electrode film 704 having a thickness of approximately 100 angstroms.

The second lower electrode film 706 is formed over the first lower electrode film 704. In some embodiments, the second lower electrode film 706 may comprise tantalum (Ta), titanium (Ti), titanium nitride (TiN), hafnium nitride (HfN), or tantalum nitride (TaN). In some embodiments, the second lower electrode film 706 may be formed to a thickness in a range of between approximately 100 angstroms and approximately 200 angstroms. A planarization process (e.g., a chemical mechanical planarization process) may subsequently be performed after deposition of the second lower electrode film 706.

A switching element 708 is formed over the second lower electrode film 706. The switching element 708 comprises the switching material discussed above, and may be, for example a high-k dielectric material such as an oxide of one or more metals. The switching element 708 may be formed to a thickness in a range of between approximately 100 angstroms and approximately 200 angstroms.

The layered lower electrode 702 and the switching element 708 may be formed by way of a deposition technique (e.g., PVD, CVD, PE-CVD, sputtering, ALD, etc.). In some embodiments, the layered lower electrode 702 and the switching element 708 may be formed by separate deposition processes. In some embodiments, the layered lower electrode 702 and the switching element 708 may be deposited in-situ (e.g., without breaking a vacuum on a processing chamber).

Figure 8:
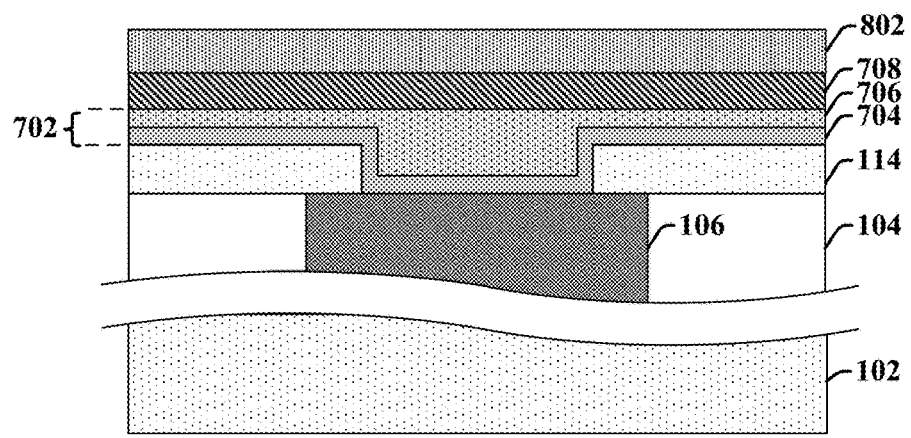

As shown in cross-sectional view 800 of FIG. 8, a capping film 802 may be formed over the switching element 708, in some embodiments. In various embodiments, the capping film 802 may comprise a metal (e.g., such as titanium (Ti), hafnium (Hf), platinum (Pt), aluminum (Al), or the like) or a metal oxide (e.g., such as titanium oxide ($TiO_x$), hafnium oxide ($HfO_x$), zirconium oxide ($ZrO_x$), germanium oxide ($GeO_x$), cesium oxide ($CeO_x$), or the like). In some alternative embodiments, the cap film 802 may be formed prior to forming the switching element 708, so that the cap film 802 is between the layered lower electrode 702 and the switching element 708. In some embodiments, the cap film 802 may be formed by way of a deposition technique (e.g., PVD, CVD, PE-CVD, sputtering, ALD, etc.).

Figure 9:
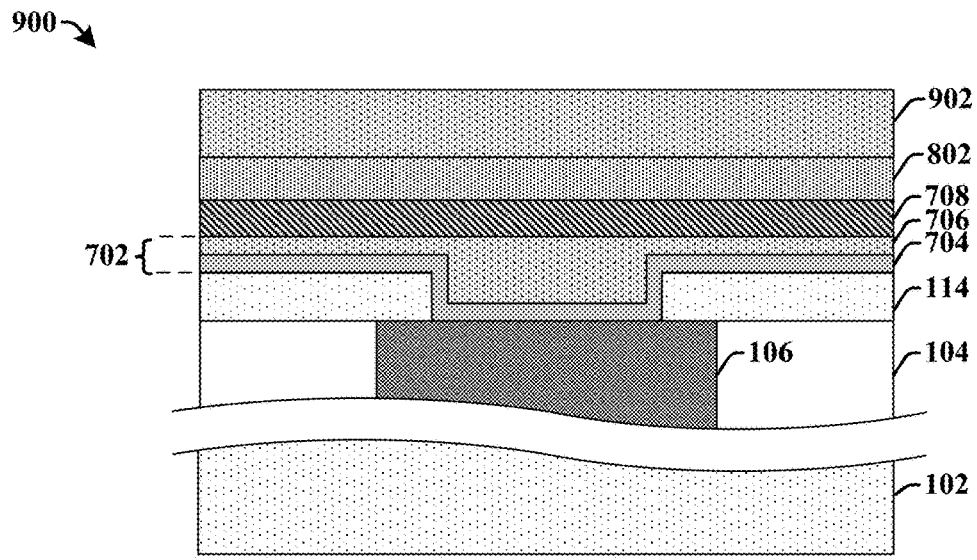

As shown in cross-sectional view 900 of FIG. 9, an upper electrode film 902 is formed over the switching element 708 and/or the cap film 802. In some embodiments, the upper electrode film 902 may comprise a metal, such as titanium (Ti) and/or tantalum (Ta). In some embodiments, the upper electrode film 902 may be formed by way of a deposition technique (e.g., PVD, CVD, PE-CVD, sputtering, ALD, etc.).

Figure 10:
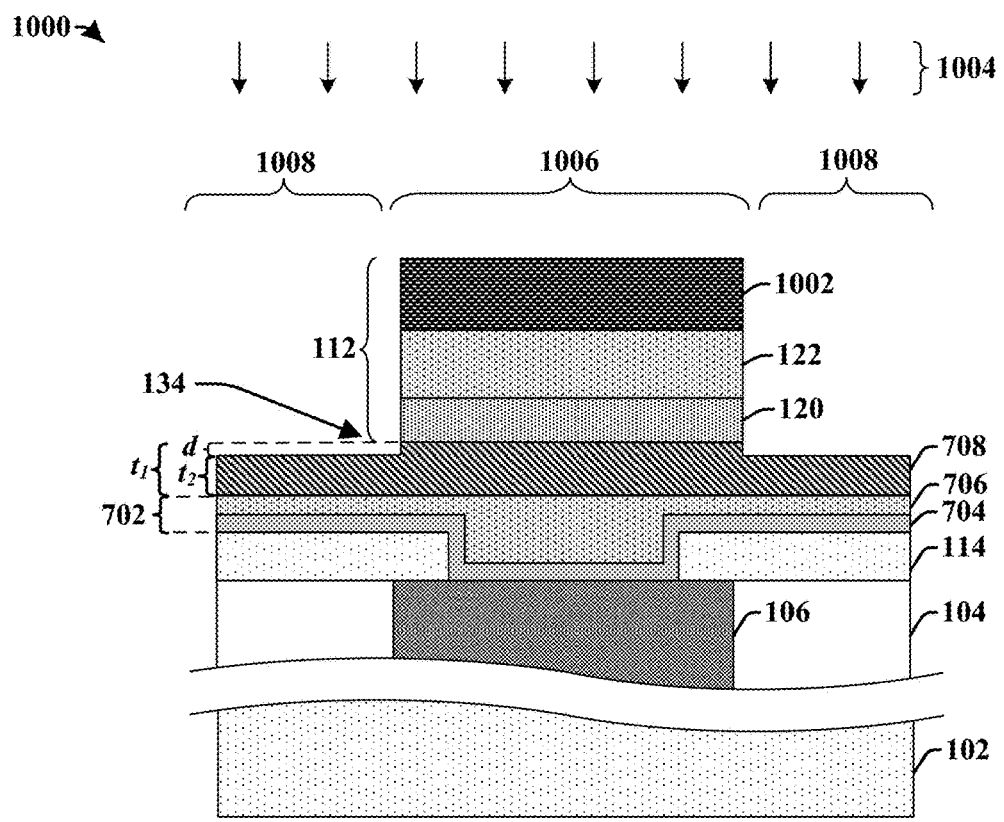

As shown in cross-sectional view 1000 of FIG. 10, a first patterning process is performed on the upper electrode film (902 of FIG. 9). In some embodiments, the first patterning process comprises forming a masking layer 1002 over the upper electrode film (902 of FIG. 9), and subsequently exposing the upper electrode film (902 of FIG. 9) to a second etching operation 1004 configured to define the upper electrode structure 112 by selectively removing unmasked parts of the upper electrode film (902 of FIG. 9). In some embodiments, the second etchant 1004 may also remove unmasked parts of the cap film (802 of FIG. 8).

In various embodiments, the etching operation 1004 may be performed using a dry etchant having an etching chemistry comprising a fluorine species (e.g., $CF_4$, $CHF_3$, $C_4F_8$, etc.) or a wet etchant comprising hydrofluoric acid (HF). In some embodiments, the first patterning process may reduce a thickness of the masking layer 1002. For example, in some embodiments, the first patterning process may reduce a thickness of the masking layer 1002 by a range of between approximately 70% and approximately 85% (e.g., from approximately 550 angstroms to approximately 100 angstroms).

In general, the patterning process cannot be stopped at a top of the switching element, and accordingly, some over etching of the switching element 708 may occur. For example, within a masked region 1006 underlying the hard mask layer 1002 the switching element 708 may have an original thickness, $t_1$, that the switching element 708 was initially deposited at. Within an unmasked regions 1008 outside of the hard mask layer 124 the switching element 708 may be subjected to over-etching thereby reducing the thickness of the switching element 708 by a distance, d, to a reduced thickness $t_2$.

Figure 11:
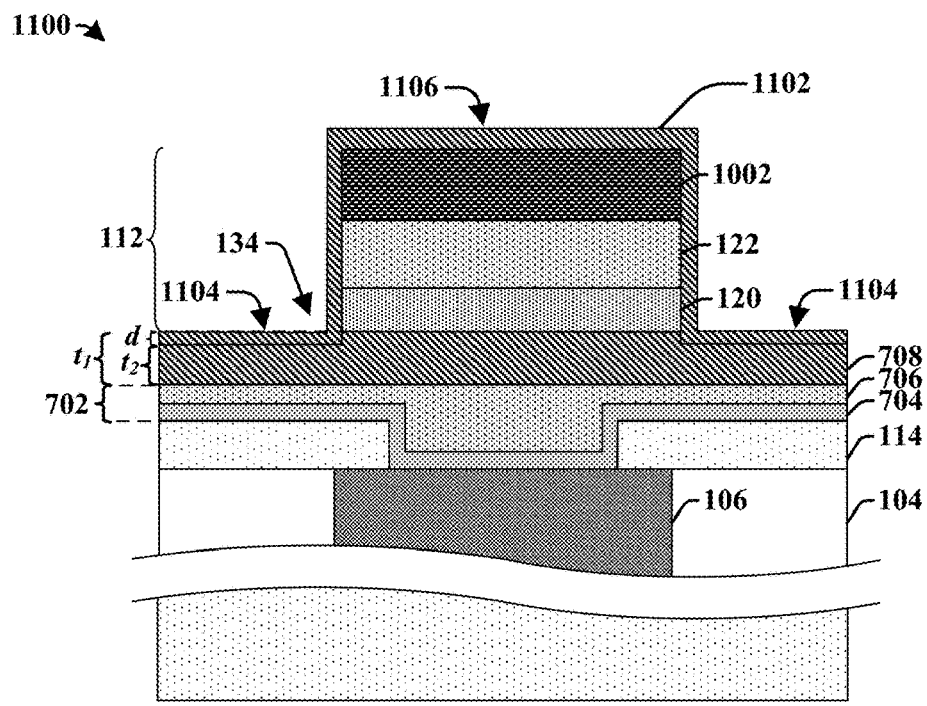

As shown in cross-sectional view 1100 of FIG. 11, a recap layer 1102 is formed over the substrate 102. The recap layer 1102 has a first upper surface 1104 and a second upper surface 1106. In some embodiments, the recap layer 1102 may be formed by depositing a recap material over the substrate 102 using a deposition technique (e.g., PVD, CVD, PE-CVD, ALD, sputtering, etc.). The recap layer 1102 is comprised of the recap material that is a similar material as the switching material of the switching element 708. Accordingly, both the switching element 708 and the recap layer 1102 may be comprised of a high-k dielectric material having similar characteristics.

In some embodiments, the recap layer 1102 may be formed to have a thickness corresponding to the distance, d, of the switching element 708 that was over-etched. In such embodiments, the first upper surface 1104 of the recap layer 1102 is collinear with the lowermost surface of the capping layer 120. In other embodiments, the recap layer 1102 may be formed to have a thickness corresponding to the distance, d, of the switching element 708 that was over-etched. In such embodiments, the first upper surface 1104 of the recap layer 1102 is above the lowermost surface of the capping layer 120 (i.e., first upper surface 1104 is at a greater distance from the layered lower electrode 702 than the lowermost surface of the capping layer 120). In some embodiments, the recap layer 1102 is deposited to have a predetermined thickness that may be, for example, 10-100 angstroms. Because the recap layer 1102 comprises a similar material as the switching material, the recap layer 1102 acts to increase the thickness of the switching element 708 at the corner 134.

Figure 12:
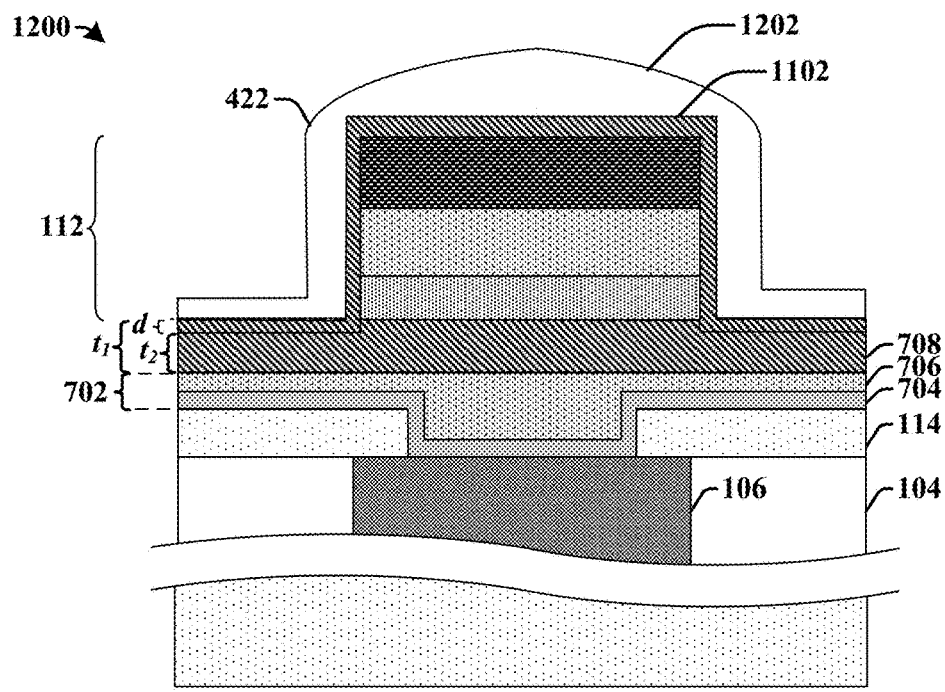

As shown in cross-sectional view 1200 of FIG. 12, a sidewall spacer layer 1202 is deposited over the substrate 102 using a deposition technique (e.g., PVD, CVD, PE-CVD, ALD, sputtering, etc.). In various embodiments, the sidewall spacer layer 1202 may comprise silicon nitride, a silicon dioxide ($SiO_2$), silicon oxy-nitride (e.g., SiON), or a similar material. In various embodiments, the spacer layer may be formed to a thickness in a range of between approximately 400 angstroms and approximately 600 angstroms.

Figure 13:
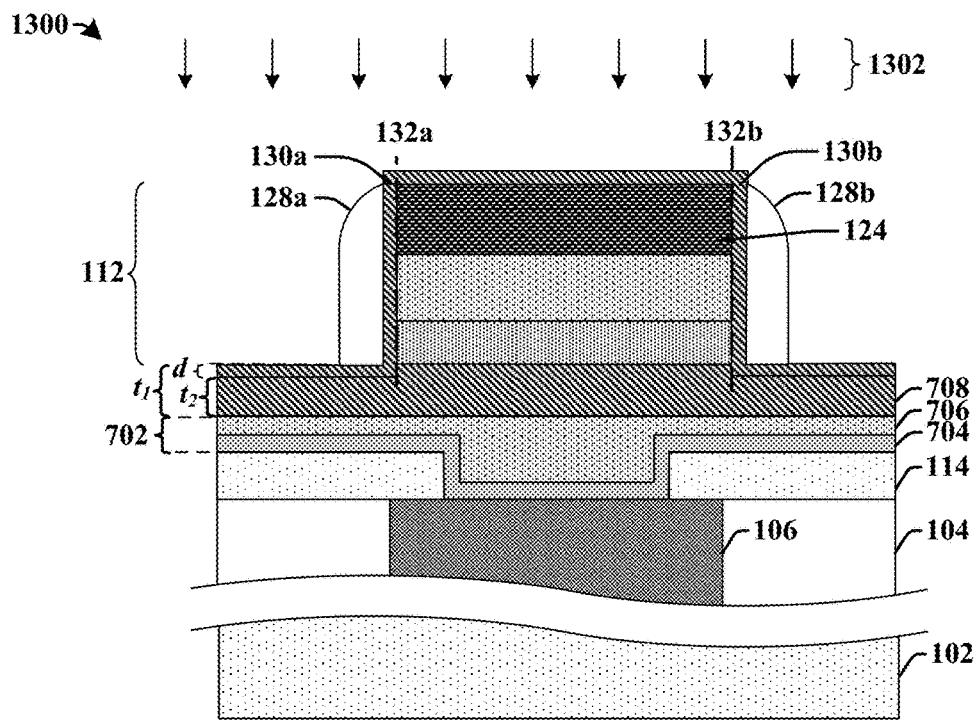

As shown in cross-sectional view 1300 of FIG. 13, the spacer layer (1202 of FIG. 12) is subsequently etched with a third etching operation 1302 to remove the spacer layer (1202 of FIG. 12) from horizontal surfaces, leaving the sidewall spacer layer (1202 of FIG. 12) along opposing sides of the upper electrode structure 112 as a first sidewall spacer 128a and a second sidewall spacer 128b, collectively referred to as the sidewall spacers 128.

Figure 14:
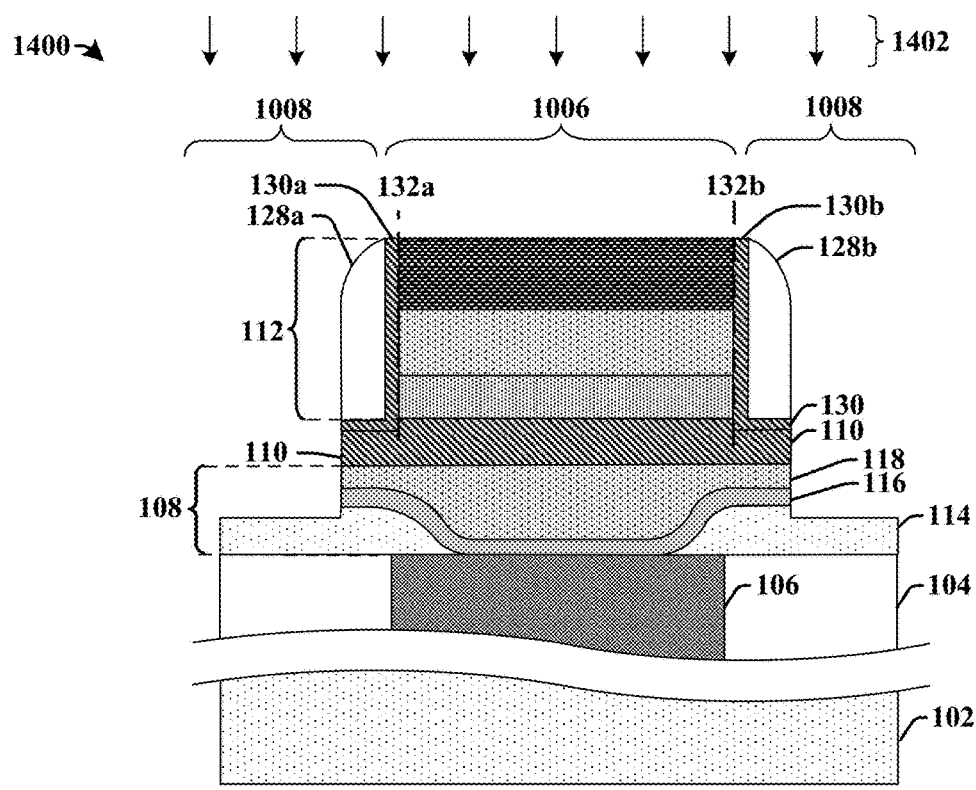

As shown in cross-sectional view 1400 of FIG. 14, a second patterning process is performed on a switching layer 110 and a lower electrode structure 108. In some embodiments, the second patterning process selectively exposes the switching element (708 of FIG. 13) and the layered lower electrode (702 of FIG. 13) to a fourth etching operation 1402 according to a mask comprising the hard mask layer 124 and the sidewall spacers 128. The fourth etchant 1402 is configured to remove unmasked parts of the switching element (708 of FIG. 13) and the layered lower electrode (702 of FIG. 13). The fourth etching operation 1402 may also reduce a thickness of the hard mask layer 124. In various embodiments, the fourth etchant 1402 may comprise a dry etchant or a wet etchant.

In some embodiments, the second patterning process may reduce a thickness of unmasked regions 1008 of the lower dielectric layer 114. For example, in some embodiments, the second patterning process may reduce a thickness of the unmasked regions 1008 of the lower dielectric layer 114 by a range of between approximately 20% and approximately 35% (e.g., from approximately 270 angstroms to approximately 220 angstroms). Reducing the thickness of the unmasked regions 1008 of the lower dielectric layer 114 causes the lower dielectric layer 114 to have a greater thickness below the bottom electrode 118 than outside of the bottom electrode 118.

Furthermore, the second etching process may remove the second upper surface (1106 of FIG. 11) of the recap layer 1102, leaving the recap layer (1102 of FIG. 11) along opposing sides of the upper electrode structure 112 as a first recap layer 130a and a second recap layer 130b, collectively referred to as the recap layers 130. The first recap layer 130a is arranged between the first sidewall spacer 128a and the first upper electrode sidewall 132a, and the second recap layer 130b is arranged between the second sidewall spacer 128b and the second upper electrode sidewall 132b.

Figure 15:
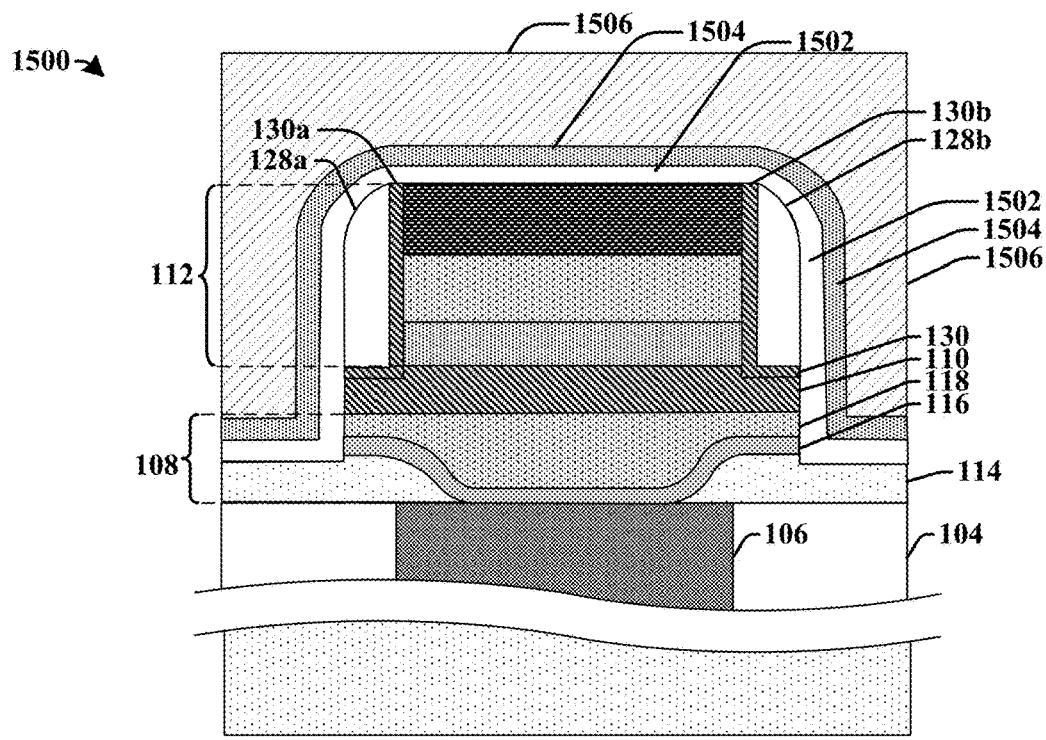

As shown in cross-sectional view 1500 of FIG. 15, a first upper dielectric layer 1502 is formed over the substrate 102. In some embodiments, a second upper dielectric layer 1504 is formed over the first upper dielectric layer 1502. An upper inter-level dielectric (ILD) layer 1506 is subsequently formed over the second upper dielectric layer 1504. The first upper dielectric layer 1502 has a first side that abuts the sidewalls of the bottom electrode 118, the switching layer 110, and the sidewall spacers 128. The first side of the first upper dielectric layer 1502 also abuts and the hard mask layer 124. The first upper dielectric layer 1502 has a second side that abuts the second upper dielectric layer 1504.

Figure 16:
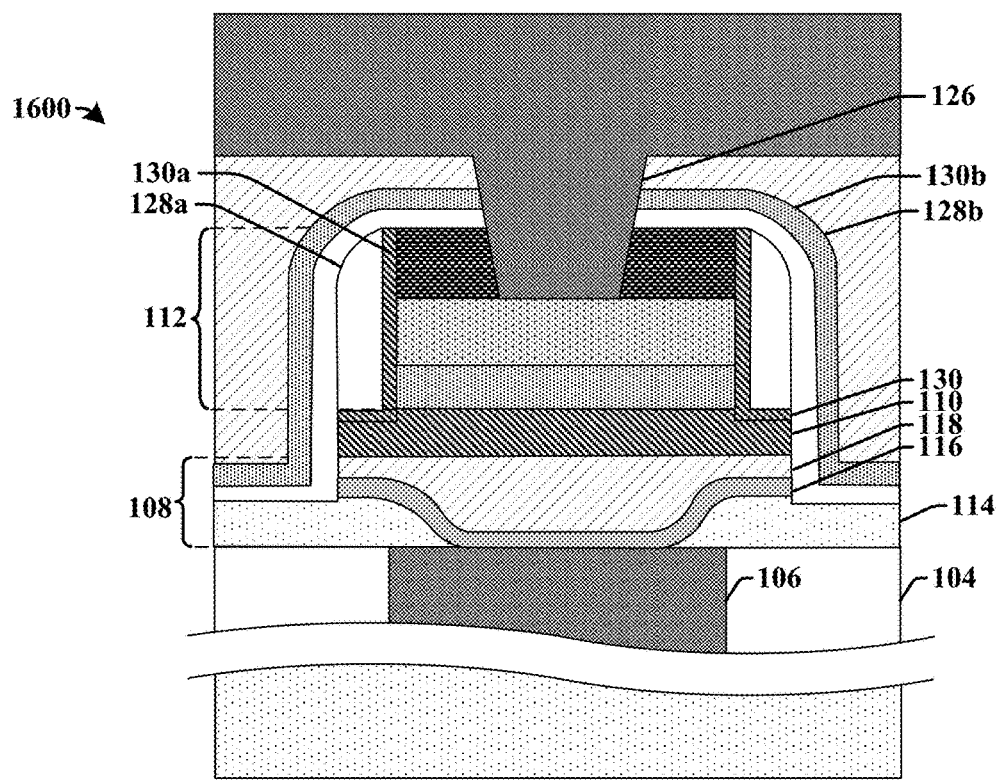

As shown in cross-sectional view 1600 of FIG. 16, an upper metal via 126 is formed at a position abutting the top electrode 122. In some embodiments, the upper metal via 126 may be formed by etching the upper ILD layer 1506 to form an opening that extends through first upper dielectric layer 1502, the second upper dielectric layer 1504, and the hard mask layer 124 to the top electrode 122. The opening is then filled with a metal (e.g., copper and/or aluminum) to form the upper metal via 126.

Figure 17:
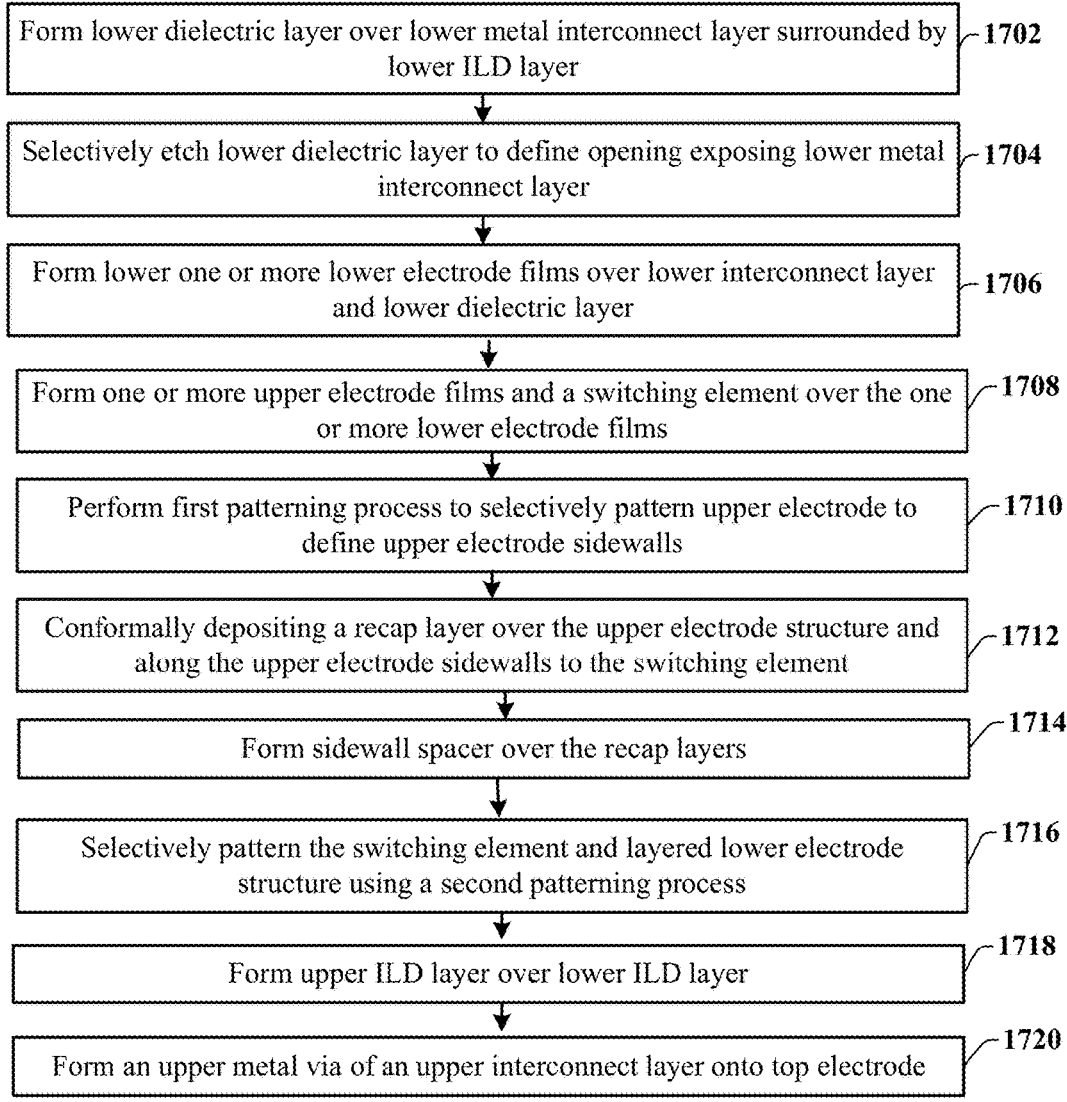
FIG. 17 illustrates a flow diagram of some embodiments of a method, of FIGS. 5-16, for forming an integrated chip comprising an RRAM device having a recap layer.

FIG. 17 illustrates a flow diagram of some embodiments of a method 1700 of forming an integrated chip comprising an RRAM device having a recap layer.

While method 1700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1702, a lower dielectric layer is formed over a lower interconnect layer surrounded by a lower inter-level dielectric (ILD) layer disposed over a semiconductor substrate. FIG. 5 illustrates some embodiments of a cross-sectional view 500 corresponding to act 1702.

At 1704, the lower dielectric layer is selectively etched to define an opening that extends through the lower dielectric layer to expose the lower interconnect layer. FIG. 6 illustrates some embodiments of a cross-sectional view 600 corresponding to act 1704.

At 1706, a layered lower electrode is formed over the lower interconnect layer and the lower dielectric layer. Additionally, a switching element is deposited over the layered lower electrode. The switching element has switching element outer sidewalls. FIG. 7 illustrates some embodiments of a cross-sectional view 700 corresponding to act 1706.

At 1708, one or more upper electrode films are formed. In some embodiments, the one or more upper electrode films include a capping layer. FIGS. 8 and 9 illustrate some embodiments of cross-sectional views 800 and 900 correspond to act 1708.

At 1710, a first patterning process is performed on the one or more upper electrode films. The first patterning process defines an upper electrode having upper electrode sidewalls. In some embodiments, the first patterning process over-etches the switching element. FIG. 10 illustrates some embodiments of a cross-sectional view 1000 corresponding to act 1710.

At 1712, a recap layer is conformally deposited over the upper electrode structure and along the upper electrode sidewalls to the switching element. The recap layer has vertical portions that extend vertically from corners of the switching element along the upper electrode sidewalls and horizontal portions that extend horizontally from the corners to the switching element outer sidewalls. FIG. 11 illustrates some embodiments of a cross-sectional view 1100 corresponding to act 1712.

At 1714, sidewall spacers are formed over the recap layer and on opposing sides of the upper electrode structure. FIGS. 12 and 13 illustrate some embodiments of cross-sectional views 1200 and 1300 corresponding to act 1714.

At 1716, the switching element and the layered lower electrode are selectively patterned using a second patterning process to define a switching layer and a lower electrode structure. FIG. 14 illustrates some embodiments of a cross-sectional view 1400 corresponding to act 1716.

At 1718, an upper ILD layer is formed over the lower ILD layer. FIG. 15 illustrates some embodiments of a cross-sectional view 1500 corresponding to act 1718.

At 1720, an upper metal via of an upper interconnect layer is formed onto the top electrode. FIG. 16 illustrates some embodiments of a cross-sectional view 1600 corresponding to act 1720.

Therefore, the present disclosure relates to a resistive random access memory (RRAM) device having a recap layer configured to provide the RRAM device with a good balance RRAM endurance and data retention, and an associated method of formation.

In some embodiments, the present disclosure relates to a resistive random access memory (RRAM) device. The RRAM device includes a lower electrode structure over a conductive lower interconnect layer, an upper electrode structure over the lower electrode structure, and a switching layer between the lower electrode and the upper electrode structure. The switching layer has switching layer outer sidewalls. The RRAM device also includes a recap layer having a vertical portion that extends vertically from corners of the switching layer along the upper electrode sidewalls. The recap layer has a horizontal portion that extends horizontally from the corners to the switching layer outer sidewalls.

In other embodiments, the present disclosure relates to a resistive random access memory (RRAM) device. The RRAM device includes a lower electrode structure over a lower interconnect layer surrounded by a lower inter-level dielectric (ILD) layer. An upper electrode structure is positioned over the lower electrode structure, and a switching layer is arranged between the lower electrode structure and the upper electrode structure. The RRAM device also includes recap layer contacting an upper surface of the switching layer and disposed along outermost sidewalls of the upper electrode structure and sidewalls of the switching layer, wherein the recap layer comprises a high-k dielectric material.

In yet other embodiments, the present disclosure relates to a method of forming a resistive random access memory (RRAM) device. The method includes forming a layered lower electrode over a lower interconnect layer. A switching element is formed over the layered lower electrode. Additionally, the method includes forming one or more upper electrode films over the switching element. The method also includes patterning the one or more upper electrode films to form an upper electrode structure having upper electrode structure sidewalls. A recap layer is deposited conformally over the upper electrode structure and along the upper electrode sidewalls to the switching element. The method further includes patterning the layered lower electrode to form a lower electrode structure and a switching layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. For example, although the disclosure describes the oxygen barrier layer as being within a multi-layer upper electrode, it will be appreciated that the oxygen barrier layer is not limited to the upper electrode. Rather, the oxygen barrier layer may also or alternatively be present in a multi-layer lower electrode.

Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A resistive random access memory (RRAM) device, comprising:
    a lower electrode structure over a conductive lower interconnect layer;
    an upper electrode structure over the lower electrode structure, wherein the upper electrode structure has upper electrode sidewalls;
    a switching layer between the lower electrode structure and the upper electrode structure, wherein the switching layer has outer sidewalls and an upper surface, and wherein the switching layer has a protruded middle section defined by a protruded middle section upper surface and protruded middle section sidewalls, wherein upper surface and the protruded middle section sidewalls meet at corners of the switching layer; and
    a recap layer having a vertical portion that extends vertically from corners of the switching layer along the upper electrode sidewalls and a horizontal portion that extends horizontally from the corners to the switching layer outer sidewalls.

2. The RRAM device of claim 1, wherein the recap layer comprises a same material as the switching layer.

3. The RRAM device of claim 2, wherein the switching layer and the recap layer are high-k dielectrics.

4. The RRAM device of claim 2, wherein the switching layer is hafnium oxide and the recap layer is one of hafnium oxide, hafnium dioxide, hafnium aluminum oxide, or hafnium silicon oxide.

5. The RRAM device of claim 1, wherein the upper electrode structure includes a top electrode and a hard mask layer, and wherein the switching layer has a first thickness in a masked region underlying the hard mask layer and a second thickness in at least one unmasked region that does not underlie the hard mask layer.

6. The RRAM device of claim 5, wherein the first thickness is greater than the second thickness by a distance, and wherein the horizontal portion of the recap layer has a recap layer thickness corresponding to the distance.

7. The RRAM device of claim 1, wherein the recap layer has a recap layer thickness of approximately 10 to 100 angstroms.

8. The RRAM device of claim 1, wherein the upper electrode structure further comprises a capping layer arranged between a conductive top electrode and the switching layer.

9. The RRAM device of claim 1, further comprising sidewall spacers separated from the upper electrode sidewalls by the recap layer.

10. A resistive random access memory (RRAM) device, comprising:
    a lower electrode structure over a lower interconnect layer surrounded by a lower inter-level dielectric (ILD) layer;
    an upper electrode structure over the lower electrode structure;
    a switching layer between the lower electrode structure and the upper electrode structure; and
    a recap layer contacting an upper surface of the switching layer, wherein the recap layer has a horizontal segment and a vertical segment protruding outward from an upper surface of the horizontal segment, the recap layer is disposed along outermost sidewalls of the upper electrode structure and sidewalls of the switching layer, wherein the recap layer comprises a high-k dielectric material.

11. The RRAM device of claim 10, wherein the recap layer comprises a same material as the switching layer.

12. The RRAM device of claim 11, wherein the recap layer comprise an oxide of hafnium, aluminum, zirconium, tantalum, lanthanum, titanium, vanadium, or niobium.

13. The RRAM device of claim 10, further comprising:
sidewall spacers arranged on opposing sides of the upper electrode structure, wherein the sidewall spacers are laterally separated from the upper electrode structure by the recap layer.

14. The RRAM device of claim 10, wherein the upper electrode structure includes a top electrode and a hard mask layer, and wherein the switching layer has a first thickness in a masked region underlying the hard mask layer and a second thickness in at least one unmasked region that does not underlie the hard mask layer.

15. The RRAM device of claim 14, wherein the first thickness is greater than the second thickness by a distance, and wherein horizontal portions of the recap layer has a recap layer thickness corresponding to the distance.

16. The RRAM device of claim 10, wherein the recap layer has a recap layer thickness of approximately 10 to 100 angstroms.

17. The RRAM device of claim 10, wherein the upper electrode structure further comprises a capping layer arranged between a conductive top electrode and the switching layer.

18. A method of forming a resistive random access memory (RRAM) device, comprising:
forming a layered lower electrode over a lower interconnect layer;
forming a switching element over the layered lower electrode;
forming one or more upper electrode films over the switching element;
patterning the one or more upper electrode films to form an upper electrode structure having upper electrode structure sidewalls;
depositing a recap layer conformally over the upper electrode structure and along the upper electrode structure sidewalls to the switching element; and
patterning the layered lower electrode to form a lower electrode structure and a switching layer.

19. The method of claim 18, wherein the switching layer and the recap layer are high-k dielectrics.

20. The method of claim 18, wherein the upper electrode structure includes a top electrode and a hard mask layer, and wherein the switching layer has a first thickness in a masked region underlying the hard mask layer and a second thickness in at least one unmasked region that does not underlie the hard mask layer, and wherein the first thickness is greater than the second thickness by a distance, and wherein the recap layer has a recap layer thickness corresponding to the distance.

* * * * *